US008471747B1

United States Patent
Ding et al.

(10) Patent No.: US 8,471,747 B1
(45) Date of Patent: Jun. 25, 2013

(54) PHASE AVERAGED PULSE WIDTH MODULATOR

(75) Inventors: Lei Ding, Plano, TX (US); Rahmi Hezar, Allen, TX (US); Joonhoi Hur, Dallas, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 13/323,511

(22) Filed: Dec. 12, 2011

(51) Int. Cl.
    *H03M 1/82* (2006.01)
(52) U.S. Cl.
    USPC .......................................... 341/152; 341/143
(58) Field of Classification Search
    USPC .......... 341/152, 155, 166, 143, 110; 375/130, 375/238
    See application file for complete search history.

(56) References Cited

U.S. PATENT DOCUMENTS

| 7,209,064 B1 | 4/2007 | Gaboriau et al. |
| 7,327,296 B1 | 2/2008 | Gaboriau et al. |
| 7,425,853 B2 | 9/2008 | Andersen et al. |
| 7,729,445 B2 | 6/2010 | Ravi et al. |
| 7,782,238 B2 | 8/2010 | Lee |
| 7,830,289 B2 | 11/2010 | Ferri |
| 8,248,138 B2 * | 8/2012 | Liu .............................. 327/291 |

FOREIGN PATENT DOCUMENTS

EP   1632073   9/2007

OTHER PUBLICATIONS

"Quadrature Integral Noise Shaping for Generation of Modulated RF Signals", Proceeding of the 45th Midwest Symposium on Circuits and Systems, vol. 2, pp. 537-540 (Midya, et al.).
"An All-Digital Universal RF Transmitter," IEEE 2004 Custom Integrated Circuits Conference (CICC), pp. 549-552 (Wagh, et al.).
U.S. Appl. No. 13/327,247, filed Dec. 15, 2011.

* cited by examiner

*Primary Examiner* — Joseph Lauture
(74) *Attorney, Agent, or Firm* — John R. Pessetto; W. James Brady; Frederick J. Telecky, Jr.

(57) ABSTRACT

A method is provided. A noise shaped signal having a plurality of instants is generated with each instant being associated with at least one of a plurality of output levels. A next phase is selected for each instant, where each next phase is a circularly shifted phase based at least in part on a previous phase for the associated output level for its instant. A plurality of PWM signals is then generated using the phase for each instant, and an amplified signal is generated from the plurality of PWM signals.

18 Claims, 9 Drawing Sheets

US 8,471,747 B1

PHASE AVERAGED PULSE WIDTH MODULATOR

TECHNICAL FIELD

The invention relates generally to reducing distortion and, more particularly, to reducing distortion using a phase averaged pulse width modulator (PWM).

BACKGROUND

Turning to FIGS. 1-3, an example of a PWM amplifier 100 can be seen. In operation, the PWM amplifier 100 receives input signal IN at the noise shaping circuit 102 (which is typically a sigma-delta modulator). Assuming that the noise shaping circuit 102 is a sigma-delta modulator or SDM that uses oversampling, this noise shaping circuit 102 can spread the total noise power over the oversampling frequency band (which is generally larger than the band-of-interest) so as to reduce in-band noise. The noise shaped signal is then applied to the digital PWM 104 so as to generate a PWM signal for use by the amplification stage 106 (which can, for example, be comprised of a digital-to-analog converter (DAC) 108 and amplifier 110 (i.e., class AB) as shown in FIG. 2 or a switching amplifier 112 (i.e., class D) as shown in FIG. 3).

One problem with this amplifier 100 is the nonlinear nature of the digital PWM 104. Some of the in-band nonlinearity associated with the digital PWM 104 can be corrected using predistortion or feedback control, but signal images and nonlinear components can be created at high frequencies (as shown in FIGS. 4A and 4B). As a result of having this high frequency content, the amplification stage 106 should have high linearity; otherwise the high frequency content will fold in-band, limiting in-band linearity. Additionally, this high frequency content can unnecessarily use power. These high frequency content also should be attenuated by high-order analog filters in order to meet spectral requirements. Thus, there is a need for an improved PWM amplifier.

Some examples of conventional systems are: U.S. Pat. No. 7,209,064; U.S. Pat. No. 7,327,296; U.S. Pat. No. 7,425,853; U.S. Pat. No. 7,782,238; and U.S. Pat. No. 7,830,289.

SUMMARY

An embodiment of the present invention, accordingly, provides an apparatus. The apparatus comprises a noise shaping circuit having a plurality of output levels; a pulse width modulator (PWM) that is configured to generate a plurality of PWM phases; a phase rotator that is coupled between the noise shaping circuit and the PWM, wherein the phase rotator circularly rotates each output level through the plurality of PWM levels; and an amplification stage that is coupled to the PWM.

In accordance with an embodiment of the present invention, the PWM further comprises a digital PWM having: a plurality of phases rotated PWM circuits that are each coupled to the noise shaping circuit; and a multiplexer that is coupled to each of the plurality of phases rotated PWM circuits and to the phase rotator.

In accordance with an embodiment of the present invention, the multiplexer further comprises a first multiplexer, and wherein the phase rotator further comprises: a plurality of tracking branches that are each coupled to the noise shaping circuit and that are each associated with at least one of the output levels; and a second multiplexer that is coupled to each tracking branch, the noise shaping circuit, and the first multiplexer, wherein the second multiplexer controls the first multiplexer, and wherein noise shaping circuit controls the second multiplexer.

In accordance with an embodiment of the present invention, each of the plurality of tracking branches further comprises: a comparator that is coupled to the noise shaping circuit and that receives a reference signal; and a tracking circuit that is coupled between the comparator and the second multiplexer.

In accordance with an embodiment of the present invention, the noise shaping circuit further comprises a sigma-delta modulator.

In accordance with an embodiment of the present invention, the amplification stage further comprises: a digital-to-analog converter (DAC) that is coupled to the first multiplexer; and an amplifier that is coupled to the DAC.

In accordance with an embodiment of the present invention, the amplification stage further comprises a switching amplifier that is coupled to the first multiplexer.

In accordance with an embodiment of the present invention, a method is provided. The method comprises generating a noise shaped signal having a plurality of instants, wherein each instant is associated with at least one of a plurality of output levels; selecting a next phase for each instant, wherein each next phase is a circularly shifted phase based at least in part on a previous phase for the associated output level for its instant; generating a plurality of PWM signals using the phase for each instant; and generating an amplified signal from the plurality of PWM signals.

In accordance with an embodiment of the present invention, the step of selecting further comprises: comparing each instant to a plurality of references so as to identify its associated output level; for each instant, determining the previous phase for its associated output level; for each instant, generating a next phase based at least in part on the previous phase; and for each instant, storing the next phase.

In accordance with an embodiment of the present invention, the step of generating the plurality of PWM signals further comprises: for each instant, selecting a phase rotated PWM circuit associated with the next phase; and for each instant, producing at least one of the PWM signals.

In accordance with an embodiment of the present invention, the step of generating the noise shaped signal further comprises generating a modulated signal with a sigma-delta modulator.

In accordance with an embodiment of the present invention, the step of generating the amplified signal further comprise: converting the plurality of PWM signals to an analog signal; and amplifying the analog signal.

In accordance with an embodiment of the present invention, the step of generating the amplified signal further comprises applying the plurality of PWM signals to a switching amplifier.

In accordance with an embodiment of the present invention, an apparatus is provided. The apparatus comprises a noise shaping circuit that is configured to generate a noise shaped signal having a plurality of instants; a digital PWM that is configured to generate a plurality of PWM phases; a phase rotator including: an identification circuit that is coupled to the noise shaping circuit and that is configured to associated each instant with at least one of a plurality of output levels; and a selection circuit that is coupled to the identification circuit and the digital PWM, wherein the selection circuit is configured to select at least one of the PWM phases for each instant, and wherein each selection is circularly rotated based at least in part on a previously selected PWM phase for its associated output level; and an amplification stage that is coupled to the digital PWM.

In accordance with an embodiment of the present invention, the digital PWM further comprises: a plurality of phases rotated PWM circuits that are each coupled to the noise shaping circuit; and a multiplexer that is coupled to each of the plurality of phases rotated PWM circuits and to the selection circuit.

In accordance with an embodiment of the present invention, the identification circuit further comprises a plurality of comparators that are each coupled to the noise shaping circuit.

In accordance with an embodiment of the present invention, the multiplexer further comprises a first multiplexer, and wherein the selection circuit further comprises: a plurality of tracking circuits, where each tracking circuit that is coupled to at least one of the comparator; and a second multiplexer that is coupled to each tracking circuit, the noise shaping circuit, and the first multiplexer, wherein the second multiplexer controls the first multiplexer, and wherein noise shaping circuit controls the second multiplexer.

In accordance with an embodiment of the present invention, the amplification stage further comprises a switching amplifier that is coupled to the first multiplexer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
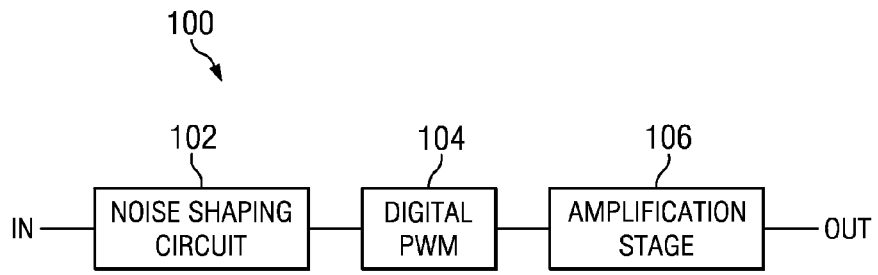
FIG. 1 is a diagram of an example of a conventional PWM amplifier.
Figure 2:
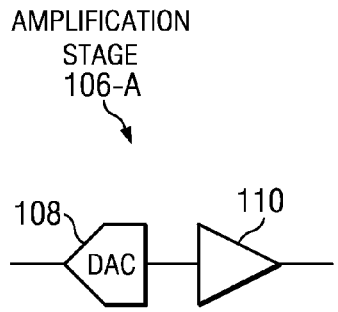
FIGS. 2 and 3 are diagrams of examples of the amplification stage of FIG. 1.
Figure 3:
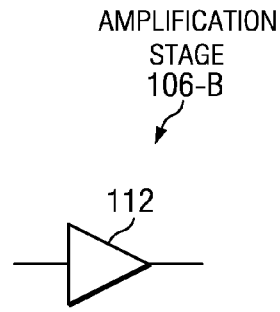

Refer now to the drawings wherein depicted elements are, for the sake of clarity, not necessarily shown to scale and wherein like or similar elements are designated by the same reference numeral through the several views.

Figure 5:
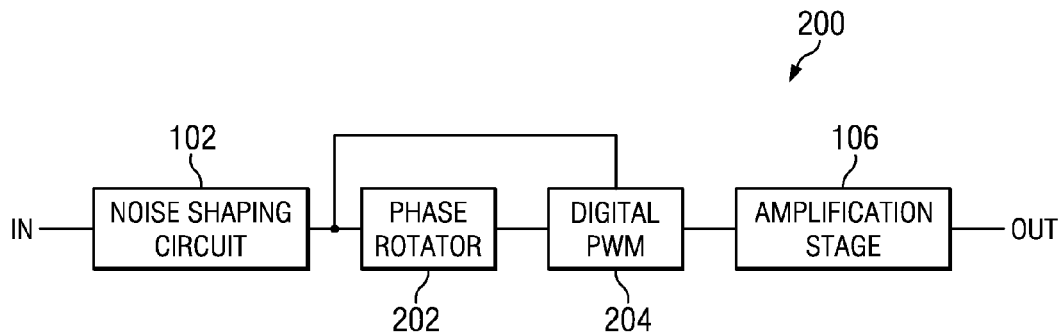
FIG. 5 is a diagram of an example of a PWM amplifier in accordance with an embodiment of the present invention.

Turning to FIG. 5, an example of a system 200 in accordance with the present invention can be seen. As shown in this example, system 200 is similar to system 100, except that digital PWM 104 has been replaced with digital PWM 204 and that phase rotator 202 has been included. The digital PWM 204 and phase rotator 202 allow for dynamic PWM coding waveform selection using a circular phase shift. Essentially, the PWM waveform sequence can be selected such that nulls are created at spectral locations where harmonics (i.e., nonlinear components) and signal images are otherwise created. This causes a significant attenuation of these nonlinear components and signal images, essentially helping to linearize the digital PWM 204. This can be referred to as circular phase averaging.

Figure 6:
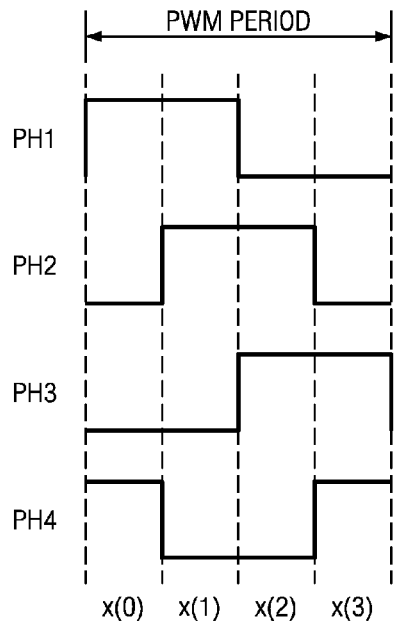
FIG. 6 is a diagram of an example of circular phase averaging.

To elaborate, an example of circular phase averaging can be seen in FIG. 6. In this example, there are four phases PH1 to PH4, and the signal $X_R(k)$ for each of phases PH1 to PH4 (denoted by subscript R) can be represented at discrete frequency points (represented by k) as follows:

$$X_R(k) = \sum_{n=0}^{3} x(n) e^{i\frac{\pi n k}{2}} \tag{1}$$

For this example, the values of 0, 1, 2, and 3 of k represent direct current (DC), FCLK/4, FCLK/2, and 3*FCLK/4, respectively (where FCLK is a clock frequency that is used to generate the PWM period). When applied to phases PH1 to PH4, equation (1) yields:

$$PH1 \begin{cases} X_1(0) = \sum_{n=0}^{3} x(n) = 1 + 1 = 2 \\ X_1(1) = \sum_{n=0}^{3} x(n) e^{i\frac{\pi n}{2}} = 1 + e^{i\frac{\pi}{2}} \\ X_1(2) = \sum_{n=0}^{3} x(n) e^{i\pi n} = 1 + e^{\pi i} \\ X_1(3) = \sum_{n=0}^{3} x(n) e^{i\frac{3\pi n}{2}} = 1 + e^{i\frac{3\pi}{2}} \end{cases} \tag{2}$$

$$PH2 \begin{cases} X_2(0) = \sum_{n=0}^{3} x(n) = 1 + 1 = 2 \\ X_2(1) = \sum_{n=0}^{3} x(n) e^{i\frac{\pi n}{2}} = e^{i\frac{\pi}{2}} + e^{i\pi} = e^{i\frac{\pi}{2}} \left(1 + e^{i\frac{\pi}{2}}\right) \\ X_2(2) = \sum_{n=0}^{3} x(n) e^{i\pi n} = e^{\pi i} + e^{2\pi i} = e^{\pi i}(1 + e^{\pi i}) \\ X_2(3) = \sum_{n=0}^{3} x(n) e^{i\frac{3\pi n}{2}} = e^{i\frac{3\pi}{2}} + e^{3\pi i} = e^{i\frac{3\pi}{2}} \left(1 + e^{i\frac{3\pi}{2}}\right) \end{cases} \tag{3}$$

$$PH3 \begin{cases} X_3(0) = \sum_{n=0}^{3} x(n) = 1 + 1 = 2 \\ X_3(1) = \sum_{n=0}^{3} x(n) e^{i\frac{\pi n}{2}} = e^{\pi i} + e^{i\frac{3\pi}{2}} = e^{\pi i}\left(1 + e^{i\frac{\pi}{2}}\right) \\ X_3(2) = \sum_{n=0}^{3} x(n) e^{i\pi n} = e^{2\pi i} + e^{3i\pi} = e^{2\pi i}(1 + e^{i\pi}) \\ X_3(3) = \sum_{n=0}^{3} x(n) e^{i\frac{3\pi n}{2}} = e^{3\pi i} + e^{i\frac{9\pi}{2}} = e^{3\pi i}\left(1 + e^{i\frac{3\pi}{2}}\right) \end{cases} \tag{4}$$

-continued $$PH4 \begin{cases} X_4(0) = \sum_{n=0}^{3} x(n) = 1+1 = 2 \\ X_4(1) = \sum_{n=0}^{3} x(n)e^{i\frac{\pi n}{2}} = 1 + e^{i\frac{3\pi}{2}} \\ X_4(2) = \sum_{n=0}^{3} x(n)e^{i\pi n} = 1 + e^{3\pi i} \\ X_4(3) = \sum_{n=0}^{3} x(n)e^{i\frac{3\pi n}{2}} = 1 + e^{i\frac{9\pi}{2}} \end{cases} \quad (5)$$

By combining the signal $X_R(k)$ for the corresponding frequency points, equations (2) through (5) yield:

$$X_{TOTAL}(0) = \sum_{j=1}^{4} X_j(0) = 8 \quad (6)$$

$$X_{TOTAL}(1) = \sum_{j=1}^{4} X_j(1) = \left(1 + e^{i\frac{\pi}{2}}\right)\left(1 + e^{i\frac{\pi}{2}} + e^{\pi i}\right) + 1 + e^{i\frac{3\pi}{2}} = \quad (7)$$

$$(1+i)(1+i-1) + 1 - i = (i-1) + 1 - i = 0$$

$$X_{TOTAL}(2) = \sum_{j=1}^{4} X_j(2) = \quad (8)$$

$$(1 + e^{\pi i})(1 + e^{\pi i} + e^{2\pi i}) + 1 + e^{3\pi i} = (1-1)(1-1+1) + 1 - 1 = 0$$

$$X_{TOTAL}(4) = \sum_{j=1}^{4} X_j(4) = \left(1 + e^{i\frac{3\pi}{2}}\right)\left(1 + e^{i\frac{3\pi}{2}} + e^{3\pi i}\right) + 1 + e^{i\frac{9\pi}{2}} = \quad (9)$$

$$(1-i)(1-i-1) + 1 + i = (-i-1) + 1 + i = 0$$

As shown in equations (6) through (9), the higher frequency components are substantially eliminated by performing the circular phase averaging shown in FIG. 6.

Figure 7:
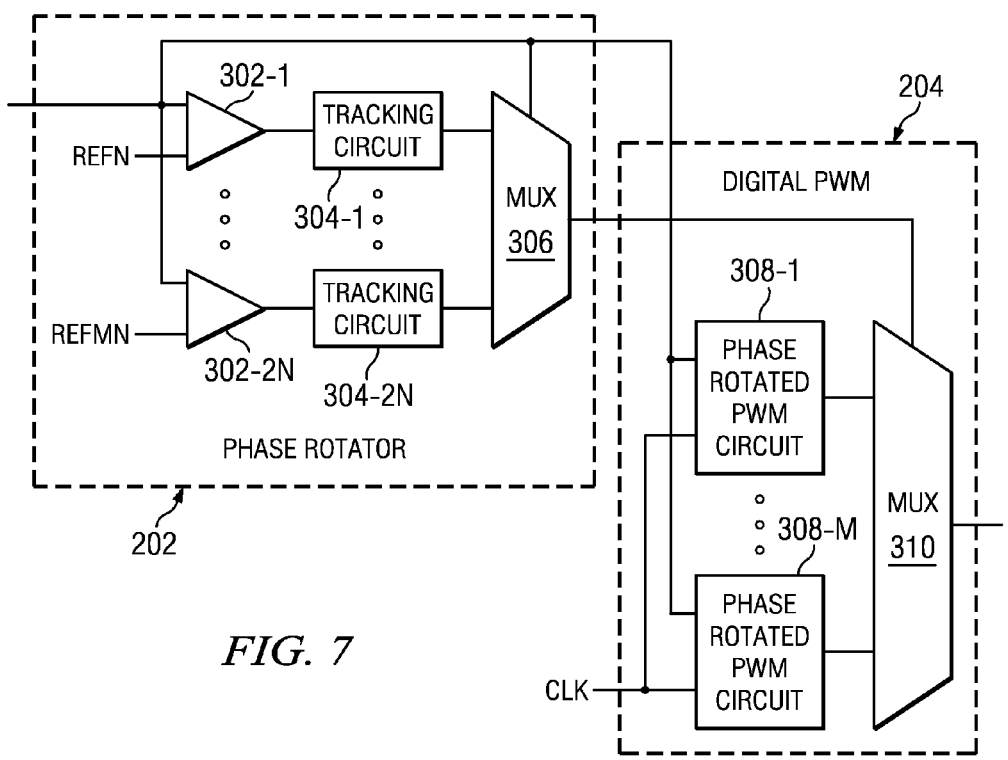
FIG. 7 is a diagram of an example of the phase rotator and digital PWM of FIG. 5.

To accomplish circular phase averaging, the phase rotator 202 monitors the noise shaped signal from the noise shaping circuit 102 and selects the appropriate phase shifted PWM pattern for the digital PWM 104 to output. In the example shown in FIG. 7, the noise shaping circuit 102 has 2N output levels (spanning from –N to N), and the phase rotator, in this example, has 2N tracking branches (which generally comprise comparators 302-1 to 302-2N that receive reference signals REFN to REFMN, respectively, and tracking circuits 304-1 to 304-2N) that correspond to these 2N output levels and that are coupled to multiplexer or mux 306. Collectively, the comparators 302-1 to 302-2N can also be referred to as an identification circuit, and the tracking circuits 304-1 to 304-2N and multiplexer 306 can be referred to as a selection circuit. This allows the tracking braches (i.e., comparators 302-1 to 302-2N and tracking circuits 304-1 to 304-2N) to track or monitor output levels of noise shaping circuit 102 and select the appropriate phase for each. With the phase rotated PWM circuits 308-1 to 308-M of digital PWM 204, each can generate a phase shifted PWM pattern or signal using the clock signal CLK, and multiplexer 310, which is controlled by the output of multiplexer 306.

Figure 4A:
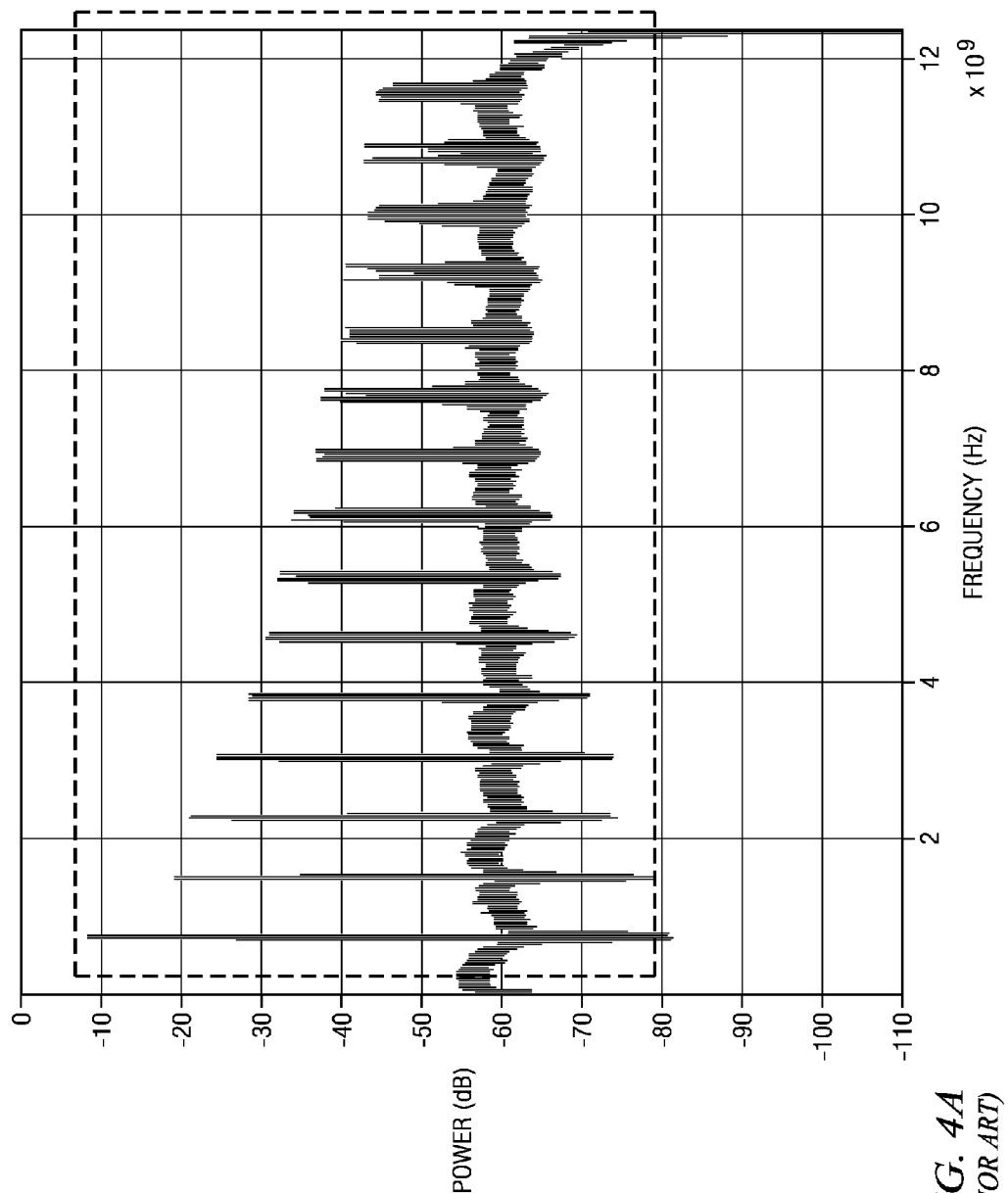
FIGS. 4A and 4B are, respectively, linear-scale and log-scale plots depicting signal images and nonlinear components created as a result of the nonlinear behavior of the digital PWM of FIG. 1.
Figure 4B:
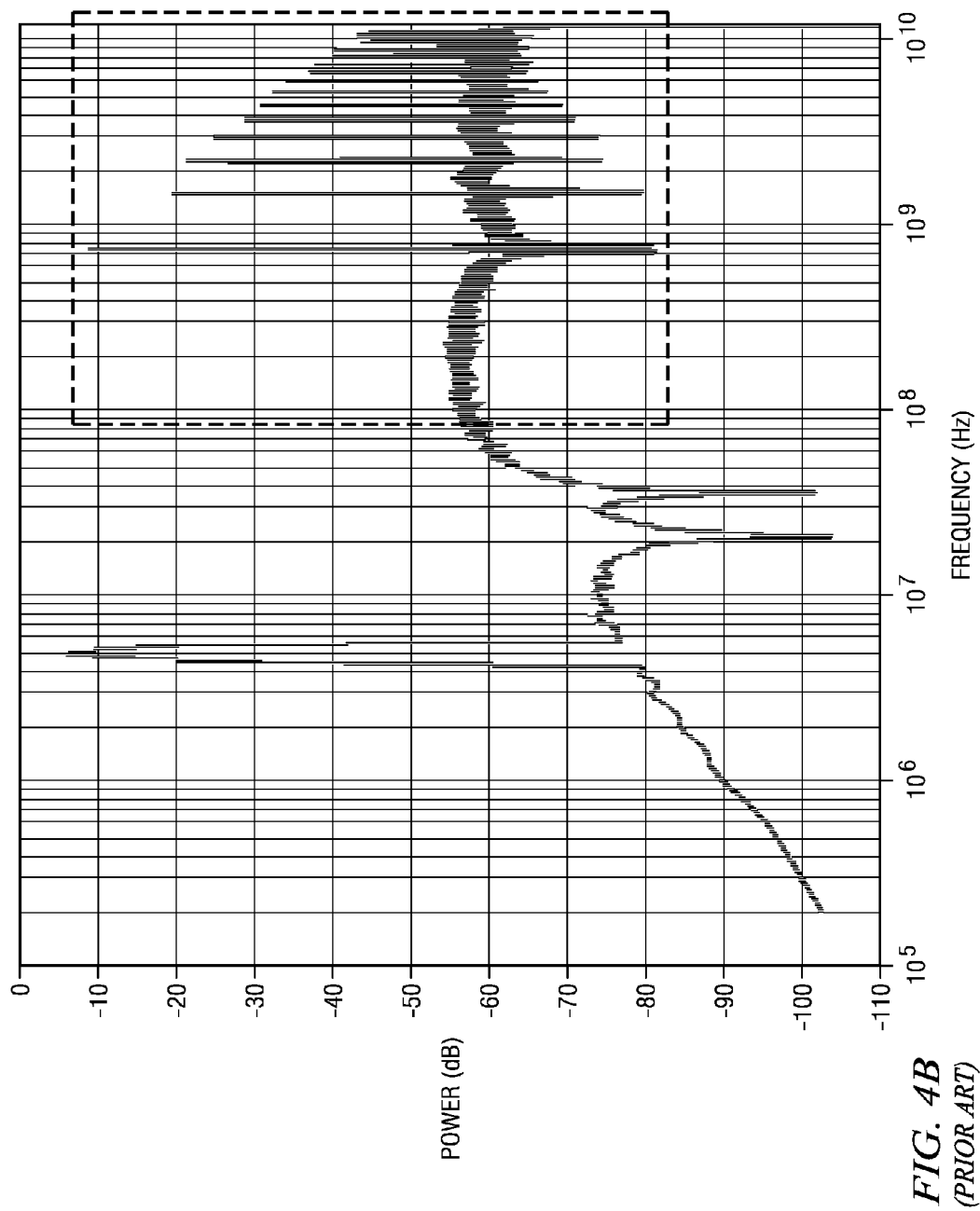
Figure 8:
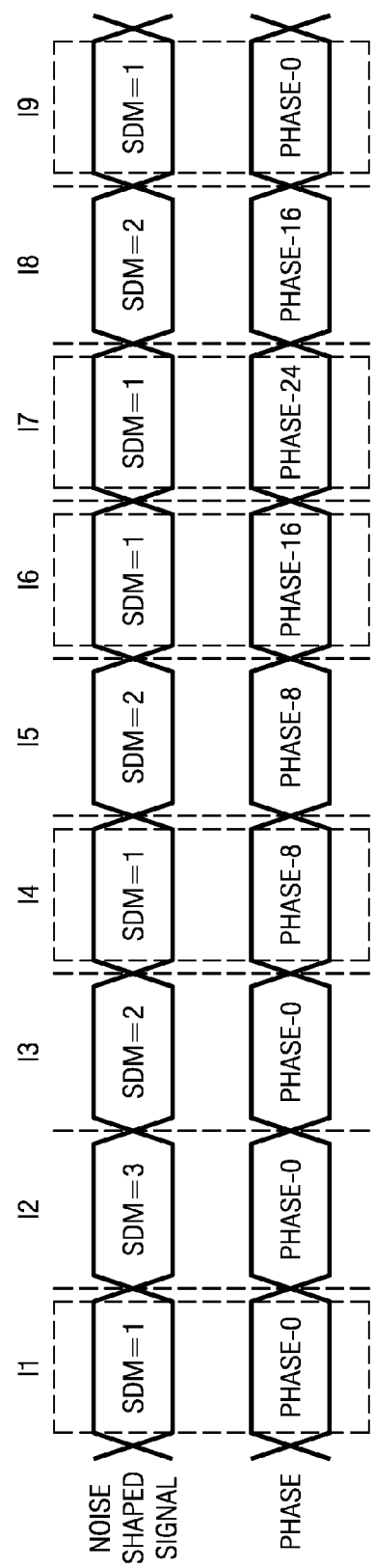
FIGS. 8-10B are diagrams depicting example operations of the PWM amplifier of FIG. 5.
Figure 9A:
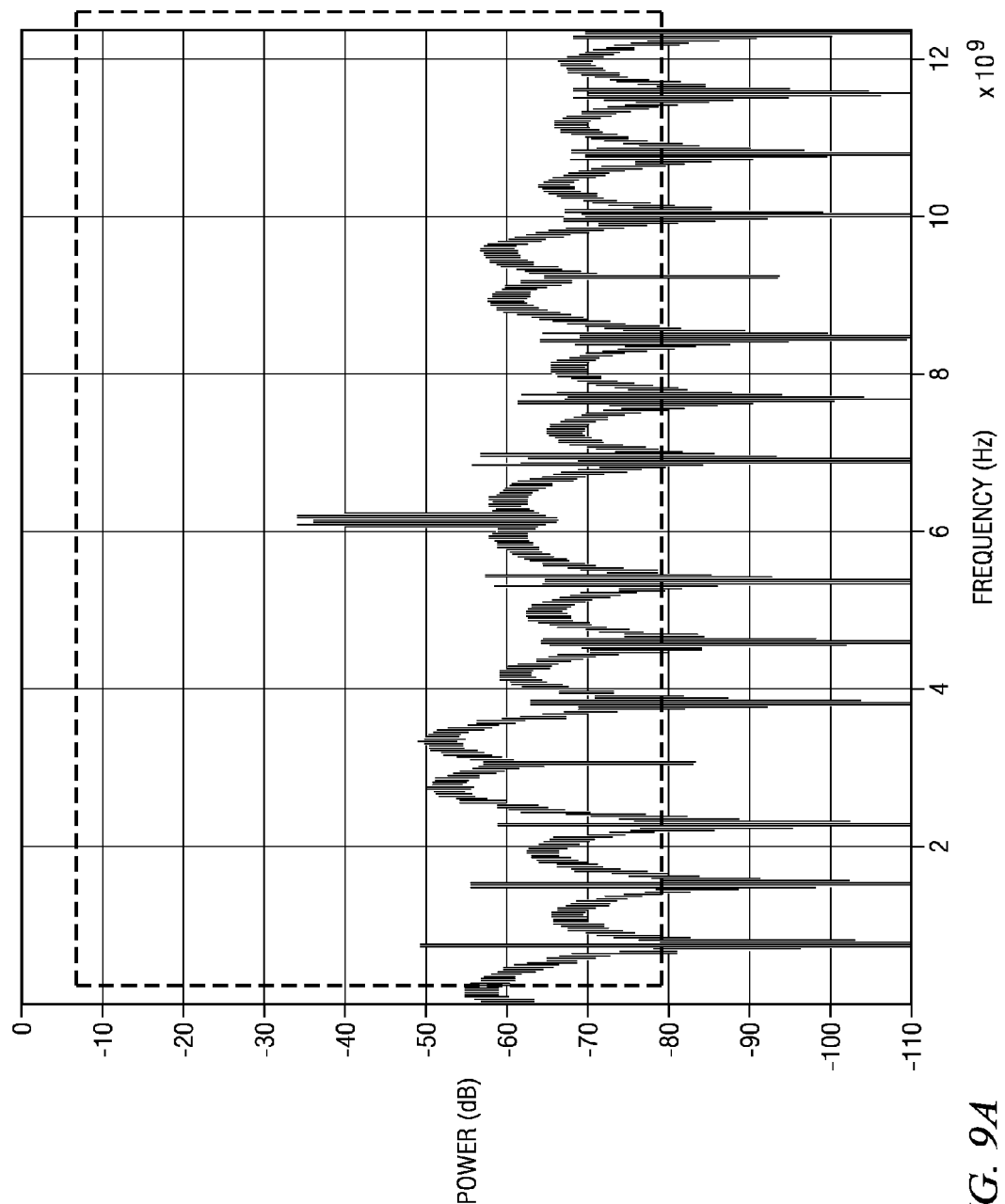
Figure 9B:
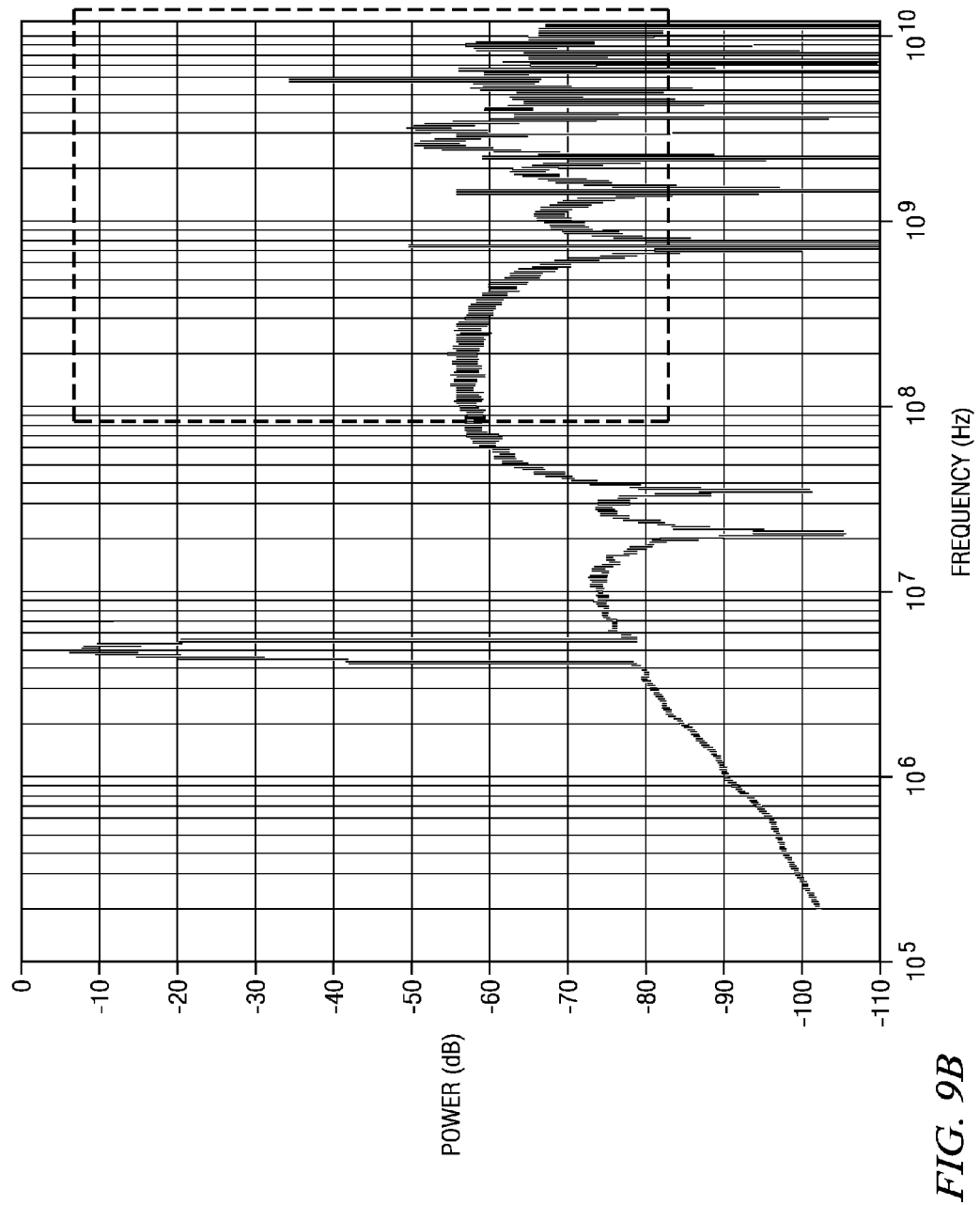
Figure 10A:
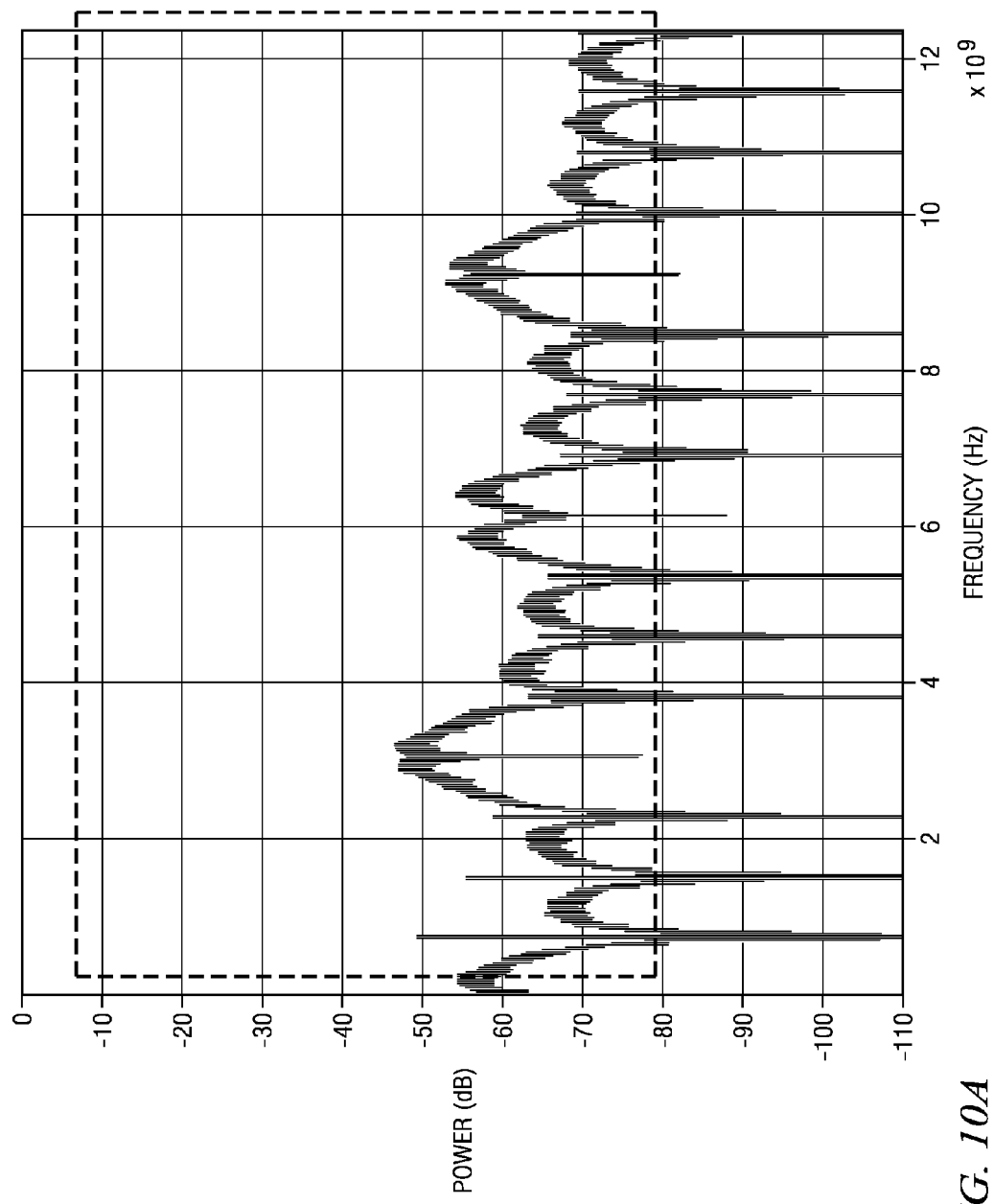
Figure 10B:
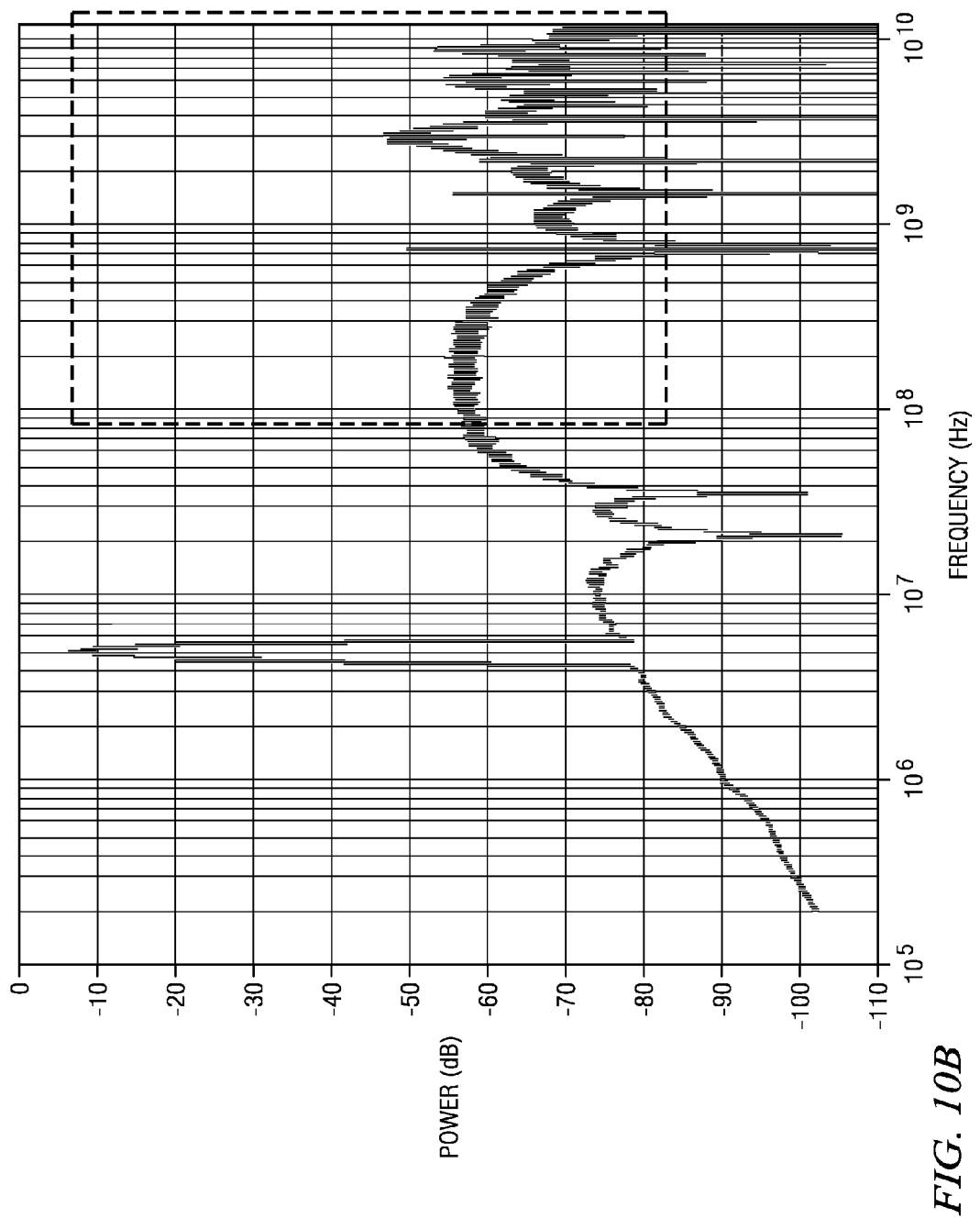

Turning to FIG. 8, an example of the operation of the phase rotator 202 and digital PWM 204 can be seen. In this example, the noise shaping circuit 102 is a sigma-delta modulator with output levels from –3 to 3; instants I1 to I9 of the noise shaped signal are also shown. Since, in this example, the output levels range from –3 to 3, the phase rotator 202 has comparators 302-1 to 302-6 and tracking circuits 304-1 to 304-6, and digital PWM 204, in this example, has phase rotated PWM circuits 308-1 to 308-4, which correspond to phase-0, phase-8, phase-16, and phase-24. Focusing on output level 1 (which is labeled SDM=1), instants I1, I4, I6, I7, and I9 of noise shaped signal are associated with this output level, meaning that the noise shaped signal (either alone or with intervening logic) controls multiplexer 306 to select the tracking branch with comparator 302-1 and tracking circuit 304-1 and meaning that comparator 302-1 detects that the noise shaped signal corresponds to this level. The tracking circuit 304-1 (through multiplexer 306) controls multiplexer 310 so as to select the appropriate next phase based on the previous phase. For example and as shown, for instant I4, tracking circuit 304-1 would select phase-8 (which is associated with phase rotated PWM circuit 308-2) as the next phase because the previous phase at instant I1 was phase-0 (which is associated with phase rotated PWM circuit 308-2). This next phase is then stored in tracking circuit 304-1 for use with the next instant associated with output level 1 (i.e., instant I6). These phase rotations for each output level then continues in a circular fashion (i.e., phase-0→phase-8→phase-16→phase-24→phase-0). As a result, the PWM amplifier 200 can be dramatically improved. As shown in FIGA. 9 and 9B (which are, respectively, linear-scale and log-scale plots averaging half of all possible phases) and in FIGS. 10A and 10B (which are, respectively, linear-scale and log-scale plots averaging all possible phases), the majority of images and high frequency components have been removed (as compared to the FIG. 4.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
  a noise shaping circuit having a plurality of output levels;
  a pulse width modulator (PWM) that is configured to generate a plurality of PWM phases;
  a phase rotator that is coupled between the noise shaping circuit and the PWM, wherein the phase rotator circularly rotates each output level through the plurality of PWM levels; and
  an amplification stage that is coupled to the PWM;
  wherein the PWM further comprises a digital PWM having:
    a plurality of phases rotated PWM circuits that are each coupled to the noise shaping circuit; and
    a multiplexer that is coupled to each of the plurality of phases rotated PWM circuits and to the phase rotator.

2. The apparatus of claim 1, wherein the multiplexer further comprises a first multiplexer, and wherein the phase rotator further comprises:
  a plurality of tracking branches that are each coupled to the noise shaping circuit and that are each associated with at least one of the output levels; and
  a second multiplexer that is coupled to each tracking branch, the noise shaping circuit, and the first multiplexer, wherein the second multiplexer controls the first multiplexer, and wherein noise shaping circuit controls the second multiplexer.

3. The apparatus of claim 2, wherein each of the plurality of tracking branches further comprises:

a comparator that is coupled to the noise shaping circuit and that receives a reference signal; and a tracking circuit that is coupled between the comparator and the second multiplexer.

4. The apparatus of claim 3, wherein the noise shaping circuit further comprises a sigma-delta modulator.

5. The apparatus of claim 4, wherein the amplification stage further comprises:

a digital-to-analog converter (DAC) that is coupled to the first multiplexer; and an amplifier that is coupled to the DAC.

6. The apparatus of claim 4, wherein the amplification stage further comprises a switching amplifier that is coupled to the first multiplexer.

7. A method comprising:

generating a noise shaped signal having a plurality of instants, wherein each instant is associated with at least one of a plurality of output levels;

selecting a next phase for each instant, wherein each next phase is a circularly shifted phase based at least in part on a previous phase for the associated output level for its instant;

generating a plurality of PWM signals using the phase for each instant; and generating an amplified signal from the plurality of PWM signals;

wherein the step of selecting further comprises:

comparing each instant to a plurality of references so as to identify its associated output level;

for each instant, determining the previous phase for its associated output level;

for each instant, generating a next phase based at least in part on the previous phase; and for each instant, storing the next phase.

8. The method of claim 7, wherein the step of generating the plurality of PWM signals further comprises:

for each instant, selecting a phase rotated PWM circuit associated with the next phase; and for each instant, producing at least one of the PWM signals.

9. The method of claim 8, wherein the step of generating the noise shaped signal further comprises generating a modulated signal with a sigma-delta modulator.

10. The method of claim 9, wherein the step of generating the amplified signal further comprise:

converting the plurality of PWM signals to an analog signal; and amplifying the analog signal.

11. The method of claim 9, wherein the step of generating the amplified signal further comprises applying the plurality of PWM signals to a switching amplifier.

12. An apparatus comprising:

a noise shaping circuit that is configured to generate a noise shaped signal having a plurality of instants;

a digital PWM that is configured to generate a plurality of PWM phases;

a phase rotator including:

an identification circuit that is coupled to the noise shaping circuit and that is configured to associated each instant with at least one of a plurality of output levels; and a selection circuit that is coupled to the identification circuit and the digital PWM, wherein the selection circuit is configured to select at least one of the PWM phases for each instant, and wherein each selection is circularly rotated based at least in part on a previously selected PWM phase for its associated output level; and an amplification stage that is coupled to the digital PWM.

13. The apparatus of claim 12, wherein the digital PWM further comprises:

a plurality of phases rotated PWM circuits that are each coupled to the noise shaping circuit; and a multiplexer that is coupled to each of the plurality of phases rotated PWM circuits and to the selection circuit.

14. The apparatus of claim 13, wherein the identification circuit further comprises a plurality of comparators that are each coupled to the noise shaping circuit.

15. The apparatus of claim 14, wherein the multiplexer further comprises a first multiplexer, and wherein the selection circuit further comprises:

a plurality of tracking circuits, where each tracking circuit that is coupled to at least one of the comparator; and a second multiplexer that is coupled to each tracking circuit, the noise shaping circuit, and the first multiplexer, wherein the second multiplexer controls the first multiplexer, and wherein noise shaping circuit controls the second multiplexer.

16. The apparatus of claim 15, wherein the noise shaping circuit further comprises a sigma-delta modulator.

17. The apparatus of claim 16, wherein the amplification stage further comprises:

a DAC that is coupled to the first multiplexer; and an amplifier that is coupled to the DAC.

18. The apparatus of claim 16, wherein the amplification stage further comprises a switching amplifier that is coupled to the first multiplexer.

* * * * *